United States Patent
Heo et al.

(10) Patent No.: US 8,406,706 B2
(45) Date of Patent: Mar. 26, 2013

(54) MOBILE TERMINAL AND METHOD OF CONTROLLING A DRIVING VOLTAGE OF A POWER AMPLIFIER THEREIN

(75) Inventors: Won Heo, Seoul (KR); Jonghun Kwon, Seoul (KR); Hungchol Chin, Seoul (KR)

(73) Assignee: LG Electronics Inc., Seoul (KR)

( * ) Notice: Subject to any disclaimer, the term of this patent is extended or adjusted under 35 U.S.C. 154(b) by 108 days.

(21) Appl. No.: 13/041,280

(22) Filed: Mar. 4, 2011

(65) Prior Publication Data

US 2011/0285461 A1    Nov. 24, 2011

(30) Foreign Application Priority Data

May 20, 2010  (KR) .................. 10-2010-0047348
May 20, 2010  (KR) .................. 10-2010-0047350

(51) Int. Cl.
*H03C 1/52* (2006.01)

(52) U.S. Cl. ..... 455/108; 455/102; 455/110; 455/127.1; 455/127.2; 455/127.5; 375/300; 375/302

(58) Field of Classification Search ............... 455/108, 455/102, 110, 127.1, 127.2, 127.5; 375/300, 375/302

See application file for complete search history.

(56) References Cited

U.S. PATENT DOCUMENTS

| | | | |
|---|---|---|---|
| 7,139,534 B2 * | 11/2006 | Tanabe et al. | 455/108 |
| 7,496,333 B2 * | 2/2009 | Matsuura et al. | 455/108 |
| 8,041,315 B2 * | 10/2011 | Hamalainen et al. | 455/127.1 |
| 8,155,604 B2 * | 4/2012 | Rofougaran | 455/102 |
| 2005/0181740 A1 | 8/2005 | Kwak | |
| 2006/0267688 A1 | 11/2006 | Tanoue et al. | |

FOREIGN PATENT DOCUMENTS

| | | |
|---|---|---|
| EP | 0626765 | 11/1994 |
| GB | 2412797 | 10/2005 |

* cited by examiner

*Primary Examiner* — Sanh Phu
(74) *Attorney, Agent, or Firm* — Lee, Hong, Degerman, Kang & Waimey

(57) ABSTRACT

A mobile terminal and method of controlling a driving voltage of a power amplifier therein are provided. The present invention includes a power amplifier module having a plurality of operative modes, the power amplifier module configured to amplify a power strength of an RF signal, a modem configured to deliver the RF signal to the power amplifier module, and to control the operative modes of the power amplifier module, a power detecting unit configured to output a reference voltage by detecting the power strength of the RF signal outputted from the power amplifier module, and a DC/DC converter configured to supply a driving voltage to the power amplifier module by adjusting a detected power value according to a gain corresponding to each of the operative modes of the power amplifier module.

20 Claims, 10 Drawing Sheets

MOBILE TERMINAL AND METHOD OF CONTROLLING A DRIVING VOLTAGE OF A POWER AMPLIFIER THEREIN

Pursuant to 35 U.S.C. §119(a), this application claims the benefit of earlier filing date and right of priority to Korean Applications Nos. 10-2010-0047348 and 10-2010-0047350, both filed on May 20, 2010, the contents of all of which are hereby incorporated by reference herein in their entirety.

BACKGROUND OF THE INVENTION

1. Field of the Invention

The present invention relates to a mobile terminal, and more particularly, to a mobile terminal and method of controlling a driving voltage of a power amplifier therein. Although the present invention is suitable for a wide scope of applications, it is particularly suitable for minimizing a current consumption of a power amplifier module according to a reception strength.

2. Discussion of the Related Art

A mobile terminal is a device which may be configured to perform various functions. Examples of such functions include data and voice communications, capturing images and video via a camera, recording audio, playing music files and outputting music via a speaker system, and displaying images and video on a display. Some terminals include additional functionality which supports game playing, while other terminals are also configured as multimedia players. More recently, mobile terminals have been configured to receive broadcast and multicast signals which permit viewing of contents, such as videos and television programs.

Generally, terminals can be classified into mobile terminals and stationary terminals according to a presence or non-presence of mobility. And, the mobile terminals can be further classified into handheld terminals and vehicle mount terminals according to availability for hand-carry.

There are ongoing efforts to support and increase the functionality of mobile terminals. Such efforts include software and hardware improvements, as well as changes and improvements in the structural components which form the mobile terminal.

Generally, a mobile terminal is provided with a power amplifier module (PA) configured to amplify power strength of an RF signal to transmit an RF signal transmitted from an RF transmitting unit by wireless via an antenna.

Meanwhile, according to a related art, a current level of a battery supplied to the power amplifier module is set the same irrespective of strength of a signal received in the course of a call.

According to the related art method, although a preset battery current is supplied to maintain a smooth call in weak reception strength, the same battery current is supplied in strong reception strength as well. Therefore, considerable battery current consumption is inevitable.

Moreover, as an excessive current consumption takes place, exothermic reaction occurs in a mobile terminal to reduce a call use duration.

SUMMARY OF THE INVENTION

Accordingly, the present invention is directed to a mobile terminal and method of controlling a driving voltage of a power amplifier therein that substantially obviate one or more problems due to limitations and disadvantages of the related art.

An object of the present invention is to provide a mobile terminal and method of controlling a driving voltage of a power amplifier therein, by which current consumption of a power amplifier module can be minimized.

Another object of the present invention is to provide a mobile terminal and method of controlling a driving voltage of a power amplifier therein, by which an optimal driving voltage can be supplied to a power amplifier module to meet an adjacent channel leakage ratio.

Another object of the present invention is to provide a mobile terminal and method of controlling a driving voltage of a power amplifier therein, by which exothermic reaction is reduced in the course of a call.

A further object of the present invention is to provide a mobile terminal and method of controlling a driving voltage of a power amplifier therein, by which a duration time of a battery can be increased.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mobile terminal according to the present invention includes a power amplifier module having a plurality of operative modes and configured to amplify a power strength of an RF signal, a modem configured to provide the RF signal to the power amplifier module and to control the plurality of operative modes of the power amplifier module, a power detecting unit configured to detect the power strength of the RF signal output from the power amplifier module and to output a reference voltage, and a DC/DC converter configured to adjust the reference voltage according to a gain corresponding to each of the plurality of operative modes of the power amplifier module and to supply a driving voltage to the power amplifier module.

In another aspect of the present invention, a mobile terminal includes a power amplifier module having a plurality of operative modes and configured to amplify a power strength of an RF signal, a modem configured to provide the RF signal to the power amplifier module and to control the plurality of operative modes of the power amplifier module, a power detecting unit configured to detect the power strength of the RF signal output from the power amplifier module and to output a reference voltage, a power comparing unit configured to compare the detected power strength to a reference power strength, and a DC/DC converter configured to supply a driving voltage to the power amplifier module according to the comparison performed by the power comparing unit, the driving voltage corresponding to a specific one of the plurality of operative modes of the power amplifier module.

Accordingly, the present invention provides the following effects and/or advantages.

First of all, the present invention can minimize current consumption of a power amplifier module according to reception strength.

Secondly, the present invention can supply an optimal driving voltage to a power amplifier module to meet an adjacent channel leakage ratio.

Thirdly, the present invention can reduce exothermic reaction in the course of a call.

Fourthly, the present invention can increase a duration time of a battery.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

The present invention can be applicable to a various types of terminals. Examples of such terminals include mobile as well as stationary terminals, such as mobile phones, user equipment, smart phones, DTV, computers, digital broadcast terminals, personal digital assistants, portable multimedia players (PMP) and navigators.

However, by way of non-limiting example only, further description will be with regard to a mobile terminal 100, and it should be noted that such teachings may apply equally to other types of terminals.

Figure 1:
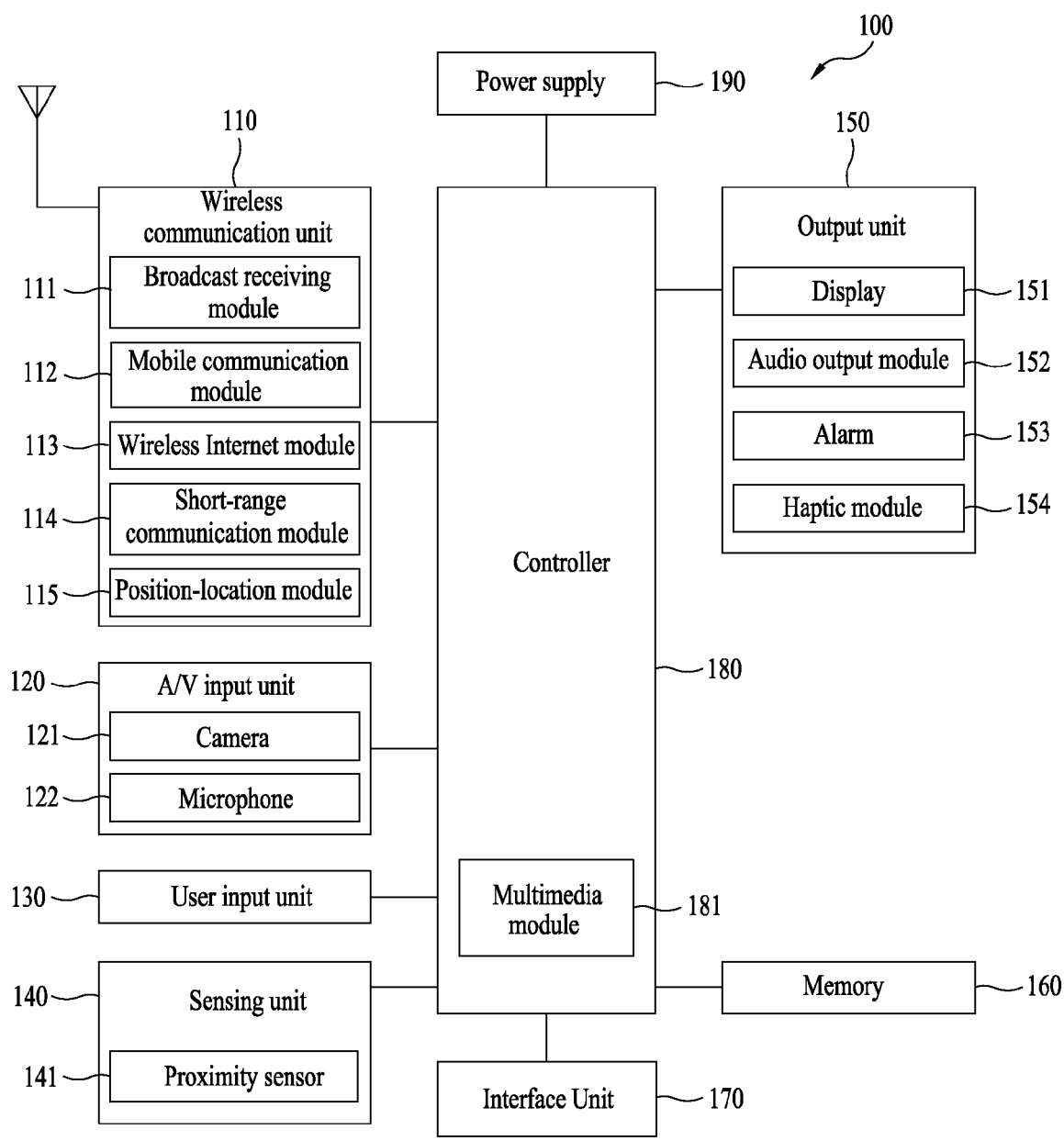
FIG. 1 is a block diagram of a mobile terminal according to one embodiment of the present invention.

FIG. 1 is a block diagram of a mobile terminal 100 in accordance with an embodiment of the present invention. FIG. 1 shows the mobile terminal 100 having various components, but it is understood that implementing all of the illustrated components is not a requirement. Greater or fewer components may alternatively be implemented.

FIG. 1 shows a wireless communication unit 110 configured with several commonly implemented components. For example, the wireless communication unit 110 typically includes one or more components which permit wireless communication between the mobile terminal 100 and a wireless communication system or network within which the mobile terminal is located. In case of non-mobile terminals, the wireless communication unit 110 can be replaced with a wire communication unit. The wireless communication unit 110 and wire communication unit can be commonly referred to as a communication unit.

A broadcast receiving module 111 receives a broadcast signal and/or broadcast associated information from an external broadcast managing entity via a broadcast channel. The broadcast channel may include a satellite channel and a terrestrial channel. The broadcast managing entity generally refers to a system which transmits a broadcast signal and/or broadcast associated information.

At least two broadcast receiving modules 111 can be provided to the mobile terminal 100 in pursuit of simultaneous receptions of at least two broadcast channels or broadcast channel switching facilitation.

Examples of broadcast associated information include information associated with a broadcast channel, a broadcast program, a broadcast service provider, etc. For example, the broadcast associated information may include an electronic program guide (EPG) of digital multimedia broadcasting (DMB) and an electronic service guide (ESG) of digital video broadcast-handheld (DVB-H).

The broadcast signal may be implemented, for example, as a TV broadcast signal, a radio broadcast signal, and a data broadcast signal. If desired, the broadcast signal may further include a broadcast signal combined with a TV or radio broadcast signal.

The broadcast receiving module 111 may be configured to receive broadcast signals transmitted from various types of broadcast systems. By nonlimiting example, such broadcasting systems include digital multimedia broadcasting-terrestrial (DMB-T), digital multimedia broadcasting-satellite (DMB-S), digital video broadcast-handheld (DVB-H), the data broadcasting system known as media forward link only (MediaFLO®) and integrated services digital broadcast-terrestrial (ISDB-T). Receiving multicast signals is also possible. If desired, data received by the broadcast receiving module 111 may be stored in a suitable device, such as a memory 160.

A mobile communication module 112 communicates wireless signals with one or more network entities such as a base station or Node-B. Such signals may represent, for example, audio, video, multimedia, control signaling, and data.

A wireless internet module 113 supports Internet access for the mobile terminal 100. This module may be internally or externally coupled to the mobile terminal 100. Suitable technologies for wireless internet may include, but are not limited to, WLAN (Wireless LAN) (Wi-Fi), Wibro (Wireless broadband), Wimax (World Interoperability for Microwave Access), and HSDPA (High Speed Downlink Packet Access). The wireless internet module can be replaced with a wire internet module in non-mobile terminals. The wireless internet module 113 and wire internet module may be commonly referred to as an internet module.

A short-range communication module 114 facilitates relatively short-range communications. Suitable technologies for short-range communication my include, but are not limited to, radio frequency identification (RFID), infrared data association (IrDA), ultra-wideband (UWB), as well as the networking technologies commonly referred to as Bluetooth and ZigBee.

A position-location module 115 identifies or otherwise obtains the location of the mobile terminal 100. This module may be implemented using, for example, global positioning system (GPS) components which cooperate with associated satellites, network components, and combinations thereof.

According to the current technology, the GPS module 115 is able to precisely calculate current 3-dimensional position information based on longitude, latitude and altitude by calculating distance information and precise time information from at least three satellites and then applying triangulation to the calculated information. Currently, location and time informations are calculated using three satellites, and errors of the calculated location position and time informations are then amended using another satellite. Besides, the GPS module 115 is able to calculate speed information by continuously calculating a real-time current location.

An audio/video (A/V) input unit 120 is configured to provide audio or video signal input to the mobile terminal 100. As shown, the A/V input unit 120 includes a camera 121 and a microphone 122. The camera 121 receives and processes image frames of still pictures or video.

The microphone 122 receives an external audio signal while the portable device is in a particular mode, such as phone call mode, recording mode or voice recognition mode. This audio signal is processed and converted into digital data.

The portable device, and specifically the A/V input unit 120, typically includes assorted noise removing algorithms to remove noise generated in the course of receiving the external audio signal. Data generated by the A/V input unit 120 may be stored in the memory 160, utilized by an output unit 150, or transmitted via one or more modules of the communication unit 110. If desired, two or more microphones and/or cameras may be used.

A user input unit 130 generates input data responsive to user manipulation of an associated input device or devices. Examples of such devices include a keypad, a dome switch, a touchpad such as static pressure/capacitance, a jog wheel and a jog switch. A specific example is one in which the user input unit 130 is configured as a touchpad in cooperation with a display, which will be described in more detail below.

A sensing unit 140 provides status measurements of various aspects of the mobile terminal 100. For example, the sensing unit may detect an open/close status of the mobile terminal 100, relative positioning of components such as a display and keypad of the mobile terminal, a change of position of the mobile terminal or a component of the mobile terminal, a presence or absence of user contact with the mobile terminal, orientation or acceleration/deceleration of the mobile terminal.

If the mobile terminal 100 is configured as a slide-type mobile terminal, the sensing unit 140 may sense whether a sliding portion of the mobile terminal is open or closed. Other examples include the sensing unit 140 sensing the presence or absence of power provided by the power supply 190, the presence or absence of a coupling or other connection between the interface unit 170 and an external device.

An interface unit 170 is often implemented to couple the mobile terminal with external devices. Typical external devices include wired/wireless headphones, external chargers, power supplies, storage devices configured to store data such as audio, video, and pictures, as well as earphones and microphones. The interface unit 170 may be configured using a wired/wireless data port, audio input/output ports, video input/output port, a card socket for coupling to a memory card, a subscriber identity module (SIM) card, a user identity module (UIM) card, or removable user identity module (RUIM) card).

When the mobile terminal 110 is connected to an external cradle, the interface unit 170 becomes a passage for supplying the mobile terminal 100 with a power from the cradle or a passage for delivering various command signals inputted from the cradle by a user to the mobile terminal 100. Each of the various command signals inputted from the cradle or the power can operate as a signal enabling the mobile terminal 100 to recognize that it is correctly loaded in the cradle.

An output unit 150 generally includes various components that support the output requirements of the mobile terminal 100. A display 151 is typically implemented to visually display information associated with the mobile terminal 100. For example, if the mobile terminal 100 is operating in a phone call mode, the display will generally provide a user interface or graphical user interface that includes information associated with placing, conducting, and terminating a phone call. As another example, if the mobile terminal 100 is in a video call mode or a photographing mode, the display 151 may additionally or alternatively display images associated with these modes.

One particular implementation includes the display 151 configured as a touch screen working in cooperation with an input device, such as a touchpad. This configuration permits the display 151 to function both as an output device and an input device.

The display 151 may be implemented using known display technologies including a liquid crystal display (LCD), a thin film transistor-liquid crystal display (TFT-LCD), an organic light-emitting diode display (OLED), a flexible display and a three-dimensional display.

Some of the above displays can be configured transparent so that an external environment can be seen through the corresponding display. Such a display can be called a transparent display. As a representative example for the transparent display, there is a transparent LCD display or the like.

The mobile terminal 100 may include one or more displays 151. An example of a two-display embodiment is one in which one display 151 is configured as an internal display viewable when the terminal is in an opened position and a second display 151 configured as an external display viewable in both the open and closed positions.

The touchscreen can be configured to detect a touch input pressure as well as a touch input position and size.

Meanwhile, a proximity sensor 141 can be provided within or around the touchscreen. The proximity sensor detects an object approaching a prescribed detecting surface or a presence or non-presence of an object existing around itself using an electromagnetic power or infrared rays without mechanical contact. Hence, the proximity sensor is superior to a contact sensor in lifespan and utilization.

Example for an operational principle of the proximity sensor 141 is explained as follows. First of all, if an object approaches a sensor detecting surface while an oscillation circuit oscillates a sine radio frequency, an oscillation amplitude of the oscillation circuit attenuates or stops. This change is converted to an electric signal to detect a presence or non-presence of the object. So, even if any material except a metallic comes between the RF oscillation proximity sensor and the object, a proximity switch is able to detect the object to detect without interference with the material.

In spite of not providing the proximity sensor 141, if the touchscreen is electrostatic, it can be configured to detect the proximity of a pointer through an electric field change attributed to the proximity of the pointer.

So, in case that the pointer is placed in the vicinity of the touchscreen without being actually contacted with the touchscreen, it is able to detect a position of the pointer and a distance between the pointer and the touchscreen. For clarity and convenience of explanation, an action for enabling the pointer approaching the touchscreen to be recognized as placed on the touchscreen is named 'proximity touch' and an action of enabling the pointer to actually come into contact with the touchscreen is named 'contact touch'. And, a position, at which the proximity touch is made to the touchscreen using the pointer, means a position of the pointer vertically corresponding to the touchscreen when the pointer makes the proximity touch.

If the proximity sensor 141 is used, it is able to sense a proximity touch and its pattern (e.g., proximity touch distance, proximity touch direction, proximity touch speed, proximity touch position, proximity touch moving state, etc.). And, it is also able to output information corresponding to the sensed proximity touch action and the proximity touch pattern to the touchscreen.

FIG. 1 further shows the output unit 150 having an audio output module 152 which supports the audio output requirements of the mobile terminal 100. The audio output module 152 is often implemented using one or more speakers, buzzers, other audio producing devices, and combinations thereof.

The audio output module 152 functions in various modes such as call-receiving mode, call-placing mode, recording mode, voice recognition mode and broadcast reception mode. During operation, the audio output module 152 outputs audio relating to a particular function or status, such as call received, message received, or errors.

The output unit 150 is further shown having an alarm 153, which is commonly used to signal or otherwise identify the occurrence of a particular event associated with the mobile terminal 100. Typical events include call received, message received and user input received.

An example of a signal provided by the output unit 150 is tactile sensations. For example, the alarm 153 may be configured to vibrate responsive to the mobile terminal 100 receiving a call or message. As another example, vibration is provided by the alarm 153 responsive to receiving user input at the mobile terminal 100, thereby providing a tactile feedback mechanism. It is understood that the various signals provided by the components of output unit 150 may be separately performed or performed using any combination of such components.

A memory 160 is generally used to store various types of data to support the processing, control, and storage requirements of the mobile terminal 100. Examples of such data include program instructions for applications operating on the mobile terminal 100, contact data, phonebook data, messages, pictures, and video.

Moreover, data for various patterns of vibration and/or sound outputted in case of a touch input to the touchscreen can be stored in the memory 160.

As map information can be stored in the memory 160, user's convenience can be further provided in a manner of providing the map information to a user if necessary. Moreover, a recent use history or a cumulative use frequency of each menu in the mobile terminal can be stored in the memory 160.

The memory 160 shown in FIG. 1 may be implemented using any type or combination of suitable volatile and non-volatile memory or storage devices including random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, card-type memory, or other similar memory or data storage device.

A controller 180 typically controls the overall operations of the mobile terminal 100. For example, the controller 180 performs the control and processing associated with voice calls, data communications, instant message communication, video calls, camera operations and recording operations.

The controller 180 may include a multimedia module 181 that provides multimedia playback. The multimedia module 181 may be configured as part of the controller 180, or implemented as a separate component.

Moreover, the controller 180 is able to perform a pattern recognizing process for recognizing a writing input and a picture drawing input carried out on the touchscreen as characters or images, respectively.

A power supply 190 provides power required by the various components for the mobile terminal 100. The power may be internal power, external power, or combinations thereof.

Various embodiments described herein may be implemented in a computer-readable medium using, for example, computer software, hardware, or some combination thereof. For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. In some cases, such embodiments may also be implemented by the controller 180.

For a software implementation, the embodiments described herein may be implemented with separate software modules, such as procedures and functions, each of which perform one or more of the functions and operations described herein. The software codes can be implemented with a software application written in any suitable programming language and may be stored in memory such as the memory 160, and executed by a controller or processor, such as the controller 180.

The mobile terminal 100 may be implemented in a variety of different configurations. Examples of such configurations include folder-type, slide-type, bar-type, rotational-type, swing-type and combinations thereof. For clarity, further disclosure will primarily relate to a slide-type mobile terminal 100. However such teachings apply equally to other types of mobile terminals.

Figure 2:
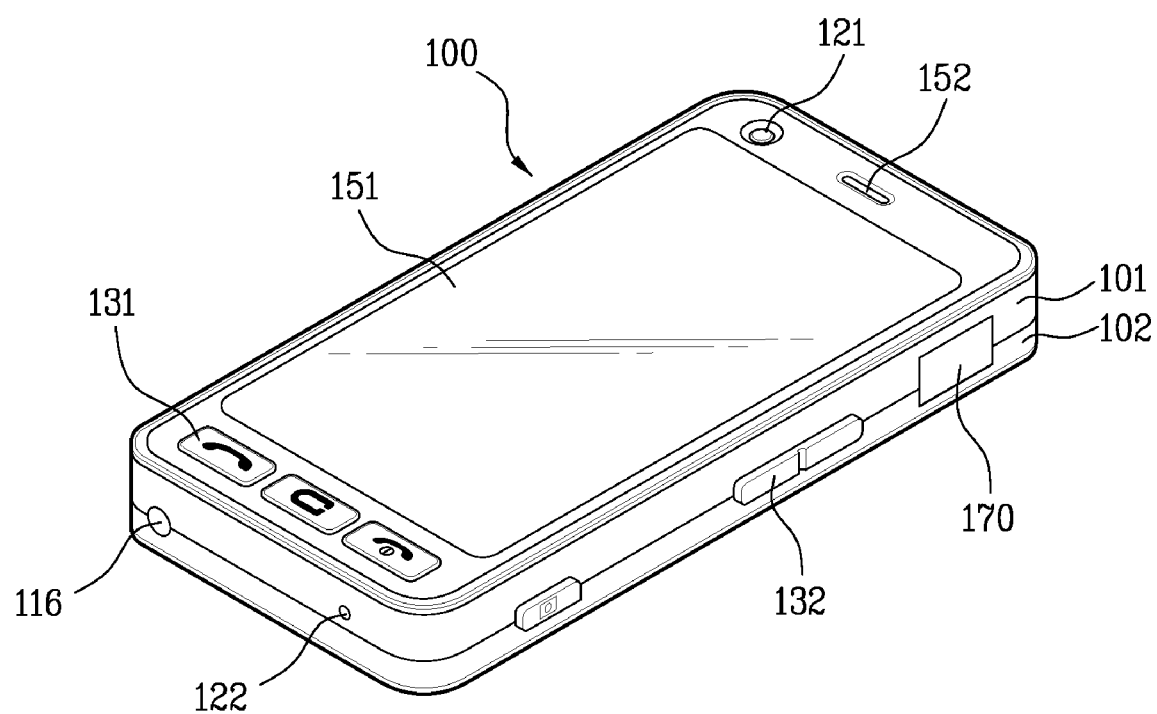
FIG. 2 is a front perspective diagram of a mobile terminal according to one embodiment of the present invention.

FIG. 2 is a front perspective diagram of a mobile terminal according to one embodiment of the present invention.

The mobile terminal 100 shown in the drawing has a bar type terminal body.

Yet, the mobile terminal 100 may be implemented in a variety of different configurations. Examples of such configurations include a folder type, a slide type, a rotational type, a swing type and combinations thereof. For clarity, further disclosure will primarily relate to a bar-type mobile terminal 100. However such teachings apply equally to other types of mobile terminals.

Referring to FIG. 2, a body of the mobile terminal 100 includes a case (e.g., a casing, a housing, a cover, etc.) configuring an exterior thereof. According to the present embodiment, the case can be divided into a front case 101 and a rear case 102. Various electric/electronic parts are loaded in a space provided between the front and rear cases 101 and 102. Optionally, at least one middle case can be further provided between the front and rear cases 101 and 102 in addition.

The cases 101 and 102 are formed by injection molding of synthetic resin or can be formed of metal substance such as stainless steel (STS), titanium (Ti) or the like for example.

A display 151, an audio output module 152, a camera 121, a user input unit 130 (131/132), a microphone, an interface 170 and the like can be provided to the terminal body, and mainly, to the front case 101.

The display 151 occupies most of a main face of the front case 101. The audio output module 151 and the camera 121 are provided to an area adjacent to one of both end portions of the display 151, while the first user input unit 131 and the microphone 122 are provided to another area adjacent to the other end portion of the display 151. The second user input unit 132, the interface 170 and the like can be provided to lateral sides of the front and rear cases 101 and 102.

The user input unit 130 is manipulated to receive an input of a command for controlling an operation of the terminal 100. And, the input unit 130 is able to include a plurality of manipulating units 131 and 132. The manipulating units 131 and 132 can be generally named a manipulating portion and may adopt any mechanism of a tactile manner that enables a user to perform a manipulating action by experiencing a tactile feeling.

Content inputted by the manipulating units 131 and 132 can be diversely set. For instance, such a command as start, end, scroll and the like is inputted to the first manipulating unit 131. And, a command for a volume adjustment of sound outputted from the audio output module 152, a command for a switching to a touch recognizing mode of the display 151 or the like can be inputted to the second manipulating unit 132.

Figure 3:
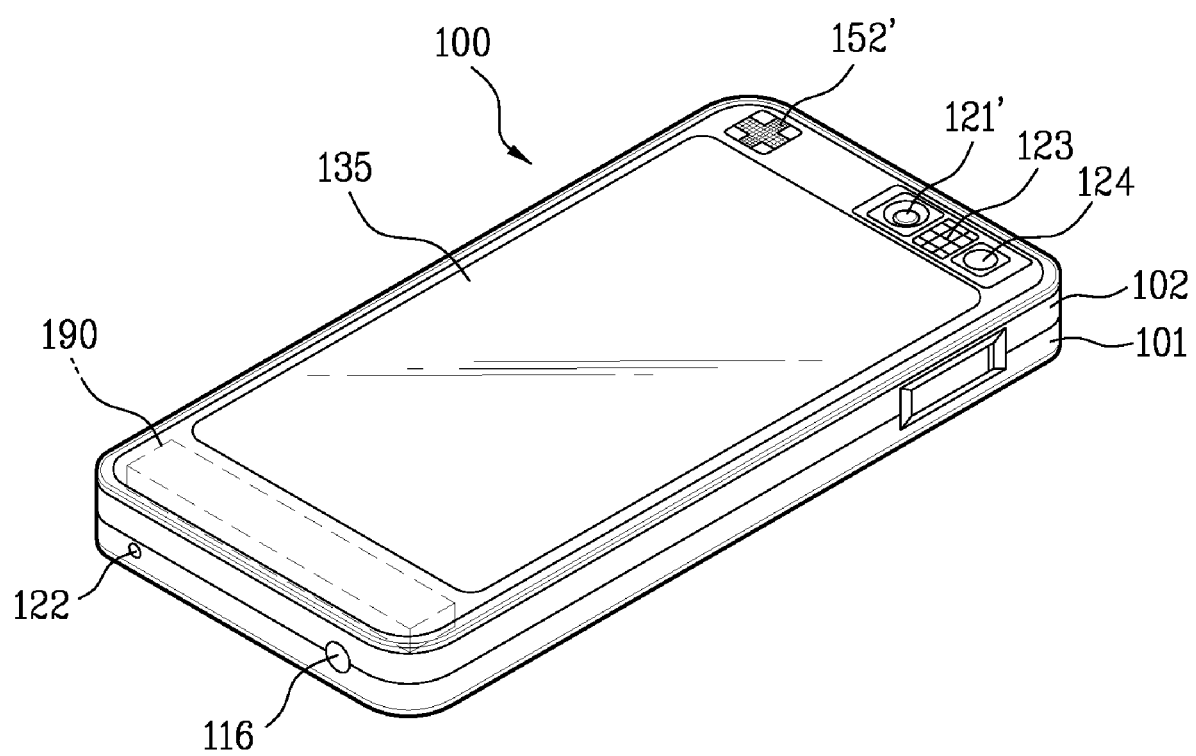
FIG. 3 is a rear perspective diagram of a mobile terminal according to one embodiment of the present invention.

FIG. 3 is a perspective diagram of a backside of the terminal shown in FIG. 2.

Referring to FIG. 3, a camera 121' can be additionally provided to a backside of the terminal body, and more particularly, to the rear case 102. The camera 121 has a photographing direction that is substantially opposite to that of the former camera 121 shown in FIG. 2 and may have pixels differing from those of the former camera 121.

Preferably, for instance, the former camera 121 has low pixels enough to take and transmit a picture of user's face for a video call, while the latter camera 121' has high pixels for capturing a general subject for photography without transmitting the captured subject.

And, each of the cameras 121 and 121' can be installed at the terminal body to be rotatable or popped up.

A flash 123 and a mirror 124 are additionally provided adjacent to the camera 121'. The flash 123 projects light toward a subject in case of photographing the subject using the camera 121'. In case that a user attempts to take a picture of the user (self-photographing) using the camera 121', the mirror 124 enables the user to view user's face reflected by the mirror 124.

An additional audio output module 152' can be provided to the backside of the terminal body. The additional audio output module 152' is able to implement a stereo function together with the former audio output module 152 shown in FIG. 2 and may be used for implementation of a speakerphone mode in talking over the terminal.

A broadcast signal receiving antenna can be additionally provided to the lateral side of the terminal body as well as an antenna for communication or the like. The antenna constructing a portion of the broadcast receiving module 111 shown in FIG. 1 can be retractably provided to the terminal body.

A power supply 190 for supplying a power to the mobile terminal 100 is provided to the terminal body. And, the power supply 190 can be configured to be built within the terminal body. Alternatively, the power supply unit 190 can be configured to be detachably connected to the terminal body.

A touchpad 135 for detecting a touch can be additionally provided to the rear case 102. The touchpad 135 can be configured in a light transmitting type like the display 151. In this case, if the display 151 is configured to output visual information from its both faces, it is able to recognize the visual information via the touchpad 135 as well. The information outputted from both of the faces can be entirely controlled by the touchpad 135. Alternatively, another display is further provided to the touchpad 135 so that a touchscreen can be provided to the rear case 102 as well.

The touchpad 135 is activated by interconnecting with the display 151 of the front case 101. The touchpad 135 can be provided in front or rear of the display 151 in parallel. The touchpad 135 can have a size equal to or smaller than that of the display 151.

In the above description, the mobile terminal 100 according to the present invention is examined in aspects of the components in association with functionality and arrangements of the components.

In the following description, a mobile terminal and method of controlling a driving voltage of a power amplifier therein are explained in detail with reference to the accompanying drawings.

Figure 4:
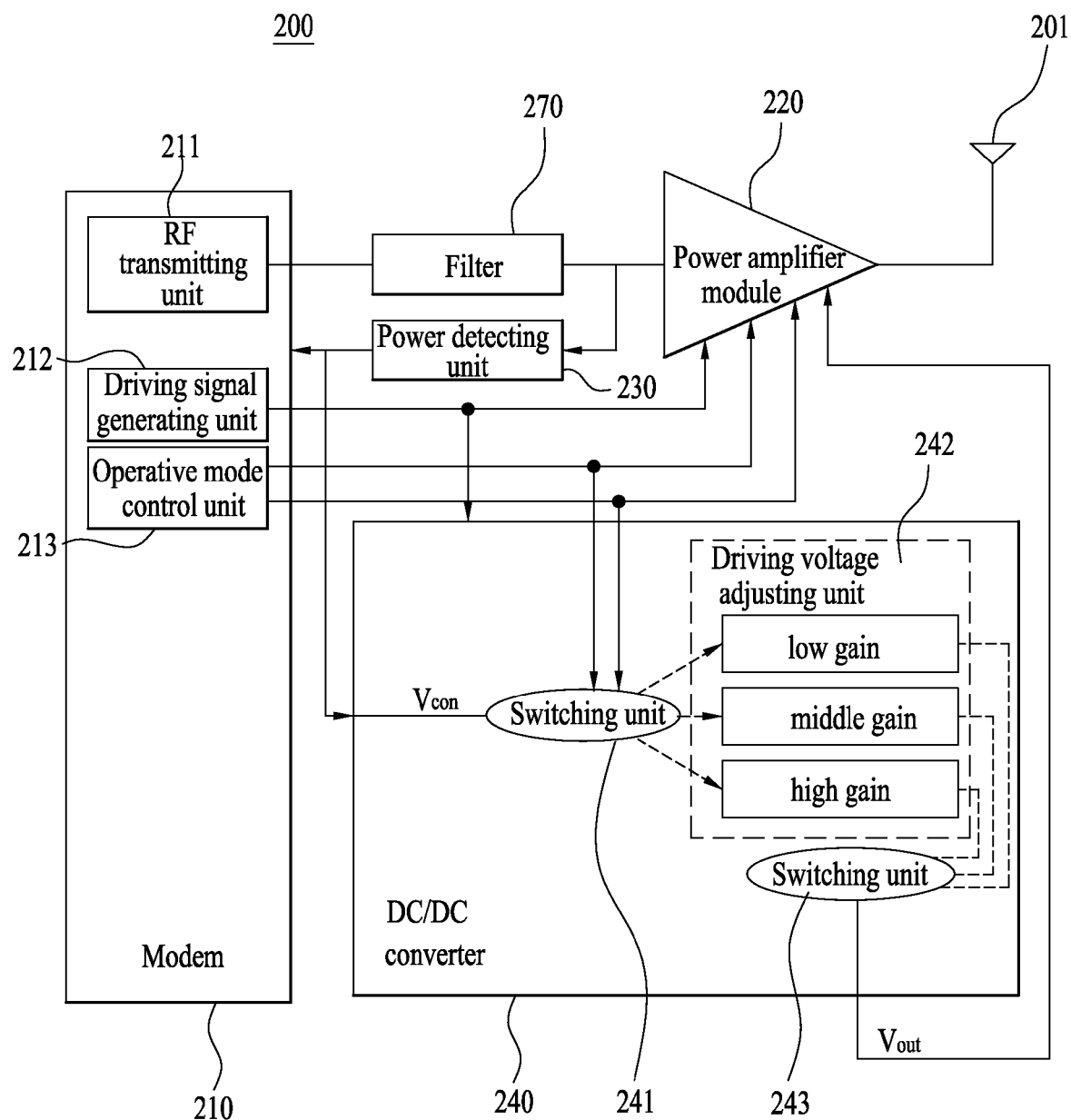
FIG. 4 is a block diagram of a mobile terminal according to a first embodiment of the present invention.

FIG. 4 is a block diagram of a mobile terminal 200 according to a first embodiment of the present invention.

Referring to FIG. 4, the mobile terminal 200 according to a first embodiment of the present invention includes a power amplifier module 220 configured to amplify power strength of an RF signal with a plurality of operative modes and a modem 210 configured to deliver the RF signal to the power amplifier module 220 and to control the operative mode of the power amplifier module 220.

Moreover, the mobile terminal 200 further includes a power detecting unit 230 configured to output a reference voltage Vcon by detecting the power strength of the RF signal outputted from the power amplifier module 220 and a DC/DC converter 240 configured to supply a driving voltage Vout to the power amplifier module 220 by adjusting the reference voltage Vcon according to a gain of the operative mode of the power amplifier module 220.

Referring to FIG. 4, the RF transmitting unit 211 receives an input of a baseband signal transmitted from the modem 210 by wireless, converts the inputted signal to an RF signal, and then outputs the RF signal to the power amplifier module 220.

In this case, a filter 270 can be additionally provided between the RF transmitting unit 211 and the power amplifier module 220. The filter 270 plays a role in matching the RF signal outputted from the RF transmitting unit 211 to be appropriate for the power amplifier module 220.

The power amplifier module 220 amplifies the power strength of the RF signal outputted via the RF transmitting unit 211 according to a mode selected from various amplification modes using the driving voltage Vout inputted from the DC/DC converter 240 and then outputs the amplified RF signal to an antenna 201. In this case, the amplification mode corresponds to the aforesaid operative mode.

In particular, the power amplifier module 220 amplifies a high-frequency signal and then delivers the amplified signal to a duplexer (not shown in the drawing). And, the antenna 201 transmits the high-frequency signal delivered via the duplexer to a public channel.

The output dBm of the power amplifier module 220 is inputted to the power detecting unit 230. The power detecting unit 230 converts output dBm to a reference voltage Vcon corresponding to the output dBm of the power amplifier module 220 and then delivers the reference voltage Vcon to the DC/DC converter 240.

In this case, the reference voltage Vcon can be proportional to the output dBm of the power amplifier module 220. And, the reference voltage Vcon can be stored as a table corresponding to each output of the power amplifier module 220 within the power detecting unit 230.

The DC/DC converter 240 adjusts the reference voltage Vcon according to a gain corresponding to the operative mode of the power amplifier module 220 and then supplies a driving voltage Vout to the power amplifier module 220.

An operative mode control unit 213 determines the operative mode of the power amplifier module 220 by determining a strength of a signal received from an RF receiving unit (not shown in the drawing) and/or a range of the output dBm of the power amplifier module 220, generates a signal corresponding to each operative mode, and then provides the generated signal to the power amplifier module 220 and the DC/DC converter 240.

For instance, a signal is received by a duplexer (not shown in the drawing) via the antenna 201, an electric field strength is detected based on the received signal, and the operative mode of the power amplifier module 220 can then be determined according to the electric field strength.

The operative mode of the power amplifier module 220 can include one of a high power mode, a middle power mode and a low power mode. Hence, gains of the DC/DC converter 240 can include a high gain, a middle gain and a low gain corresponding to the power modes, respectively.

In particular, in case of the high power mode, the gain of the DC/DC converter 240 is determined as the high gain. In case of the middle power mode, the gain of the DC/DC converter 240 is determined as the middle gain. In case of the low power mode, the gain of the DC/DC converter 240 is determined as the low gain.

Meanwhile, the number of the operative modes of the power amplifier module 220 is equal to 2 or at least 4. In this case, the number of the gains can be set to the number of the operative modes (i.e., 2 or at least 4).

A size of the gain can increase higher from the high gain to the low gain. For instance, if the high gain is about 2.5V/V, the middle gain and the low gain can becomes about 2.8V/V and 3.1V/V, respectively.

In this case, a driving voltage Vout supplied to the power amplifier module 220 is determined as a value resulting from multiplying the reference voltage Vcon by each gain.

Referring to FIG. 4, the DC/DC converter 240 can include a memory unit having a plurality of gains stored therein, a first switching unit 241 configured to select a gain according to an operative mode of the power amplifier module 220, and a driving voltage adjusting unit 242 configured to adjust a reference voltage Vcon using the selected gain.

As mentioned in the foregoing description, operative mode information of the power amplifier module 220 is inputted to the first switching unit 241 from the operative mode control unit 213. And, a reference voltage Vcon according to an output dBm of the power amplifier module 220 is inputted to the first switching unit 241 from the power detecting unit 230.

Moreover, the first switching unit 241 selects one of the gains according to the operative mode of the power amplifier module 220. For instance, in case of a high power mode, the first switching unit 241 selects a high gain.

The driving voltage adjusting unit 242 determines a driving voltage Vout of the power amplifier module 220 in a manner of multiplying the inputted reference voltage Von by the selected gain.

In the drawing, a reference number 243 indicates a second switching unit. The second switching unit 243 plays a role in delivering the adjusted driving voltage Vout outside the DC/DC converter 240.

The DC/DC converter 240 can further include a gain adjusting unit (not shown in the drawing) configured to adjust a size of each gain by connecting a resistor and the like.

Therefore, in order to minimize a current consumption, if a driving voltage Vout according to an output of the power amplifier module 220 needs to be changed, the driving voltage Vout supplied to the power amplifier module 220 may be changed by adjusting a size of the gains through the gain adjusting unit.

The modem 210 includes a driving signal generating unit 212 configured to control each of the power amplifier module 220 and the DC/DC converter 240 to be turned on/off. The DC/DC converter 240 is activated only if the power amplifier module 220 is operating. Hence, it is able to reduce a current consumption of a battery according to the activation of the DC/DC converter 240.

Figure 5:
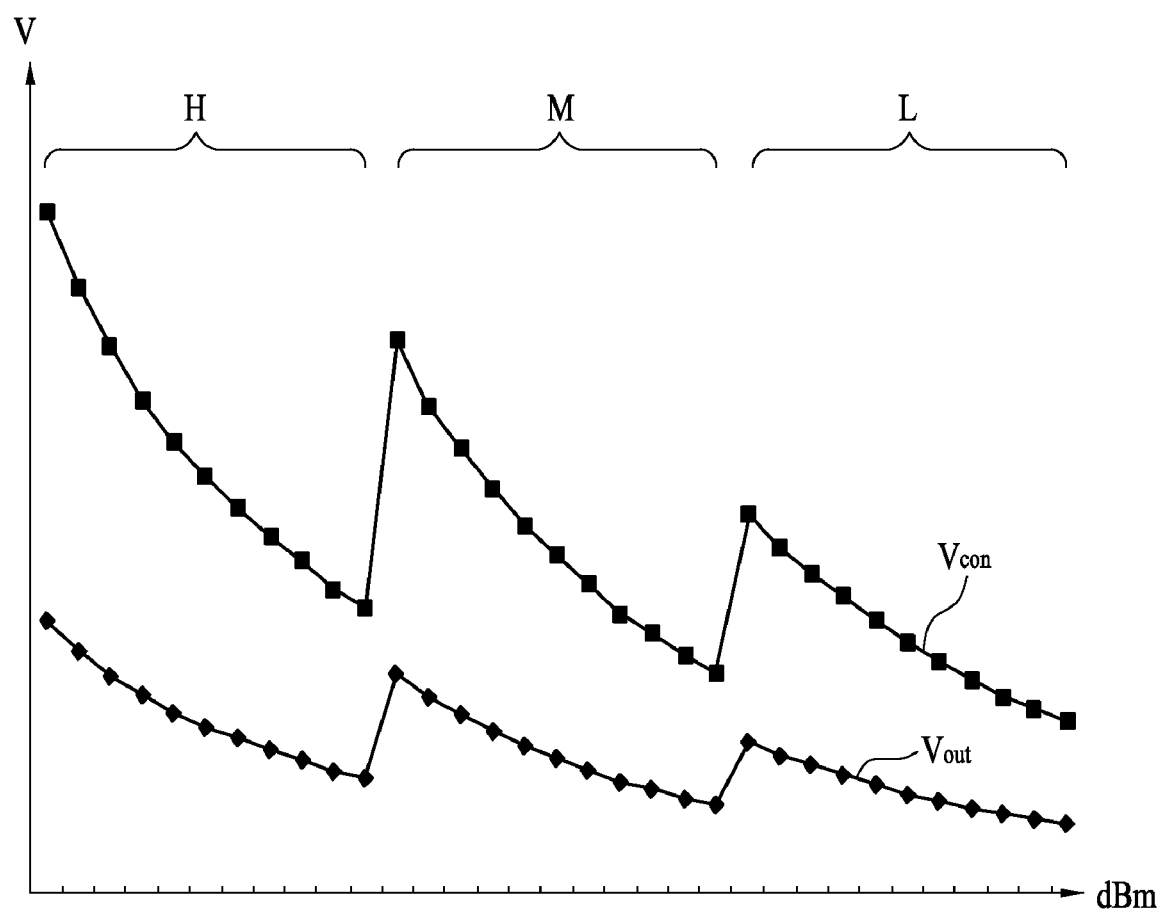
FIG. 5 is a graph for describing a relation between an output of a power amplifier module configuring a mobile terminal according to the first embodiment of the present invention and a driving voltage.

FIG. 5 is a graph for describing a relation between an output of the power amplifier module 220 configuring a mobile terminal 200 and a driving voltage according to a first embodiment of the present invention.

Referring to FIG. 5, as mentioned in the foregoing description, 'Vcon' indicates a reference voltage outputted from the power detecting unit 230 and 'Vout' indicates a driving voltage outputted from the DC/DC converter 240.

In this case, as mentioned in the foregoing description, the driving voltage Vout is determined as a value resulting from multiplying the reference voltage Vcon by each gain according to the operative mode of the power amplifier module 220.

In the graph, 'H' indicates a high power mode, 'M' indicates a middle power mode, and 'L' indicates a low power mode.

If the driving voltage Vout of the power amplifier module 220 has a lower value, a current is not excessively supplied to the power amplifier module 220. Therefore, energy consumed as heat is minimized, whereby a current consumption decreasing effect of a battery can be maximized.

Referring to FIG. 5, each of the driving voltage Vout and the reference voltage Vcon rises high in the operative mode of the power amplifier module 220, i.e., in a gain varying section. This means that characteristics of a multi-stage power amplifier module 220 are taken into consideration. In order to satisfy the characteristics, as mentioned in the foregoing description, high, middle and low gains should have variable gain values set to about 2.5V/V, 2.8V/V and 3.1V/V, respectively.

The driving voltage Vout can include a minimum voltage that meets an adjacent channel leakage ratio (ACLR) of RF specification. Preferably, the reference voltage Vcon of the power detecting unit 230 and a value of each gain according to an operative mode are determined to meet the minimum voltage.

TABLE 1

| Classification | Output of power amplifier module (dBm) | Reference voltage (Vcon) | Driving voltage (Vout) |
| --- | --- | --- | --- |
| high gain | 26.63 | 1.15 | 2.875 |
| | 22.07 | 0.76 | 1.9 |
| | 15.92 | 0.48 | 1.2 |
| middle gain | 15.58 | 0.93 | 2.325 |
| | 10.32 | 0.57 | 1.425 |
| | 5.15 | 0.37 | 0.925 |
| low gain | 5.15 | 0.64 | 1.6 |
| | 0.22 | 0.42 | 1.05 |
| | −4.52 | 0.29 | 0.725 |

Table 1 shows values of reference and driving voltages Vcon and Vout according to an output of the power amplifier module 220. In Table 1, high, middle and low gains have values set to about 2.5V/V, 2.8V/V and 3.1V/V, respectively.

In order to minimize the current consumption of the battery, as mentioned in the foregoing description, a proper driving voltage should be supplied according to the operative mode and output of the power amplifier module 220. Yet, the driving voltage should be equal to or greater than a minimum voltage that meets the adjacent channel leakage ratio of the RF specification.

The driving voltage Vout can include the minimum voltage that meets the adjacent channel leakage ratio of the RF specification. Hence, in order to meet this condition, a size of a reference voltage Vcon and each gain value according to each operative mode and an output DBm of the power amplifier module are adjustable.

Referring to Table 1, a reference voltage Vcon corresponding to each output dBm of the power amplifier module 220 can be provided to the power detecting unit 230. In particular, the reference voltage Vcon can be prepared not to change abruptly according to the output dBm of the power amplifier module 220 but to have a continuous value. In this case, the reference voltage Vcon can be proportional to the output dBm of the power amplifier module 220.

Through the DC/DC converter 240, the driving voltage of the power amplifier module 220 is adjusted to lower a driving voltage Vout according to the output dBm of the power amplifier module 220. As the driving voltage Vout is lowered, it is able to prevent a current from being excessively supplied to the power amplifier module 220. Therefore, energy consumed as heat can be minimized so that a current consumption decreasing effect of a battery can be maximized.

Figure 6:
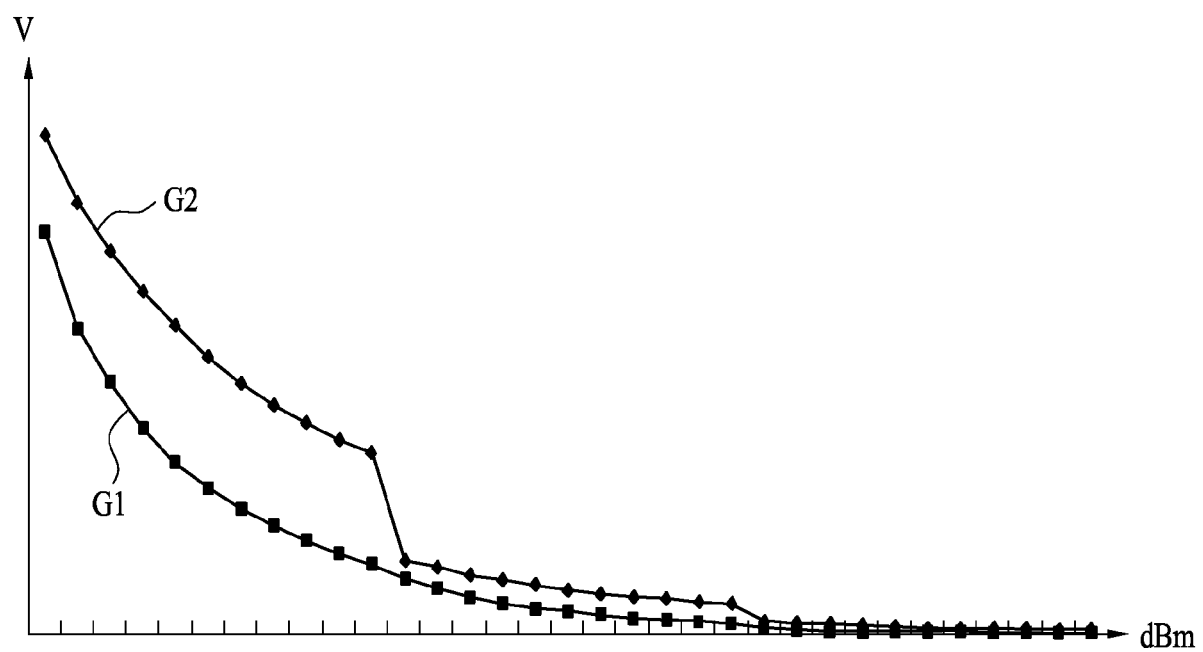
FIG. 6 is a graph for describing a relation between an output of a power amplifier module configuring a mobile terminal according to the first embodiment of the present invention and a current consumption.

FIG. 6 is a graph for describing a relation between an output of the power amplifier module 220 configuring the mobile terminal and a current consumption according to a first embodiment of the present invention.

In FIG. 6, 'G1' indicates a graph of a current consumption of the power amplifier module in the mobile terminal according to the present invention. And, 'G2' indicates a current consumption of the power amplifier module in the mobile terminal according to the related art.

Referring to FIG. 6, 'G2' indicates a current consumption in case of using only a power amplifier module without adjusting a driving voltage. In each of 3 sections in which a current consumption abruptly changes, gains of a multi-stage power amplifier module change into a high gain, a middle gain and a low gain, respectively.

'G1' shows a case that a driving voltage is adjusted according to an operative mode of the power amplifier module. Compared to 'G2', it can be observed from 'G1' that a current consumption continuously decreases without an abruptly varying section.

In particular, as mentioned in the foregoing description, the mobile terminal 200 according to a first embodiment of the present invention continuously outputs a reference voltage Vcon according to an output dBm of the power amplifier module 220 via the power detecting unit 230. The reference voltage Vcon is adjusted via a gain according to an operative mode of the power amplifier module 220. Therefore, a current consumption can be continuously reduced without an abruptly varying section.

As mentioned in the foregoing description, the mobile terminal 200 according to at least one embodiment of the present invention adjusts a driving voltage of the power amplifier module 220 according to a reception strength, thereby minimizing a current consumption of the power amplifier module.

Moreover, the mobile terminal 200 according to at least one embodiment of the present invention reduces exothermic reaction in the course of a call and is able to increase a duration time of a battery.

In the following description, a method of controlling a driving voltage of the power amplifier module 220 in the above-described mobile terminal 200 according to a first embodiment of the present invention is explained in detail.

The method of controlling a driving voltage of the power amplifier module 220 according to a first embodiment of the present invention includes (a) outputting a reference voltage by detecting a power strength of an RF signal outputted from a power amplifier module, (b) determining an operative mode of the power amplifier module, (c) outputting the driving voltage by adjusting the reference voltage using a gain according to the operative mode, and (d) delivering the driving voltage to the power amplifier module.

As mentioned in the foregoing description, the operative mode of the power amplifier module 220 includes one of a high power mode, a middle power mode and a low power mode. The gain can include one of a high gain, a middle gain and a low gain, which corresponds to each power mode.

The step (a) can be performed by the power detecting unit 230, the step (b) can be performed by an operative mode control unit 313 of a modem 310, and the step (c) can be performed by a DC/DC converter 340.

The step of outputting the driving voltage can include the steps of selecting the gain according to the operative mode and adjusting the reference voltage using the selected gain.

The reference voltage can be proportional to an output of the power amplifier module. The driving voltage can include a minimum voltage for satisfying an adjacent channel leakage ratio.

As mentioned in the foregoing description, in order to minimize a current consumption of a battery, it is necessary to supply a proper driving voltage according to an operative mode and output of a power amplifier module 220. Yet, the driving voltage should be equal to or greater than a minimum voltage that satisfies an adjacent channel leakage ratio of RF specification.

The driving voltage can include the minimum voltage required for driving the power amplifier module 220 to satisfy the adjacent channel leakage ratio of the RF specification. Hence, in order to meet this condition, a size of a reference voltage and a value of each gain according to each operative mode and an output of the power amplifier module 220 are adjustable.

As mentioned in the foregoing description, a reference voltage Vcon corresponding to each output dBm of the power amplifier module 220 can be provided to the power detecting unit 230. In particular, the reference voltage Vcon can be prepared not to change abruptly according to the output dBm of the power amplifier module 220 but to have a continuous value. In this case, the reference voltage Vcon can be proportional to the output dBm of the power amplifier module 220.

Through the DC/DC converter 240, the driving voltage of the power amplifier module 220 is adjusted to lower a driving voltage Vout according to the output dBm of the power amplifier module 220. As the driving voltage Vout is lowered, it is able to prevent a current from being excessively supplied to the power amplifier module 220. Therefore, energy consumed as heat can be minimized so that a current consumption decreasing effect of a battery can be maximized.

Figure 7:
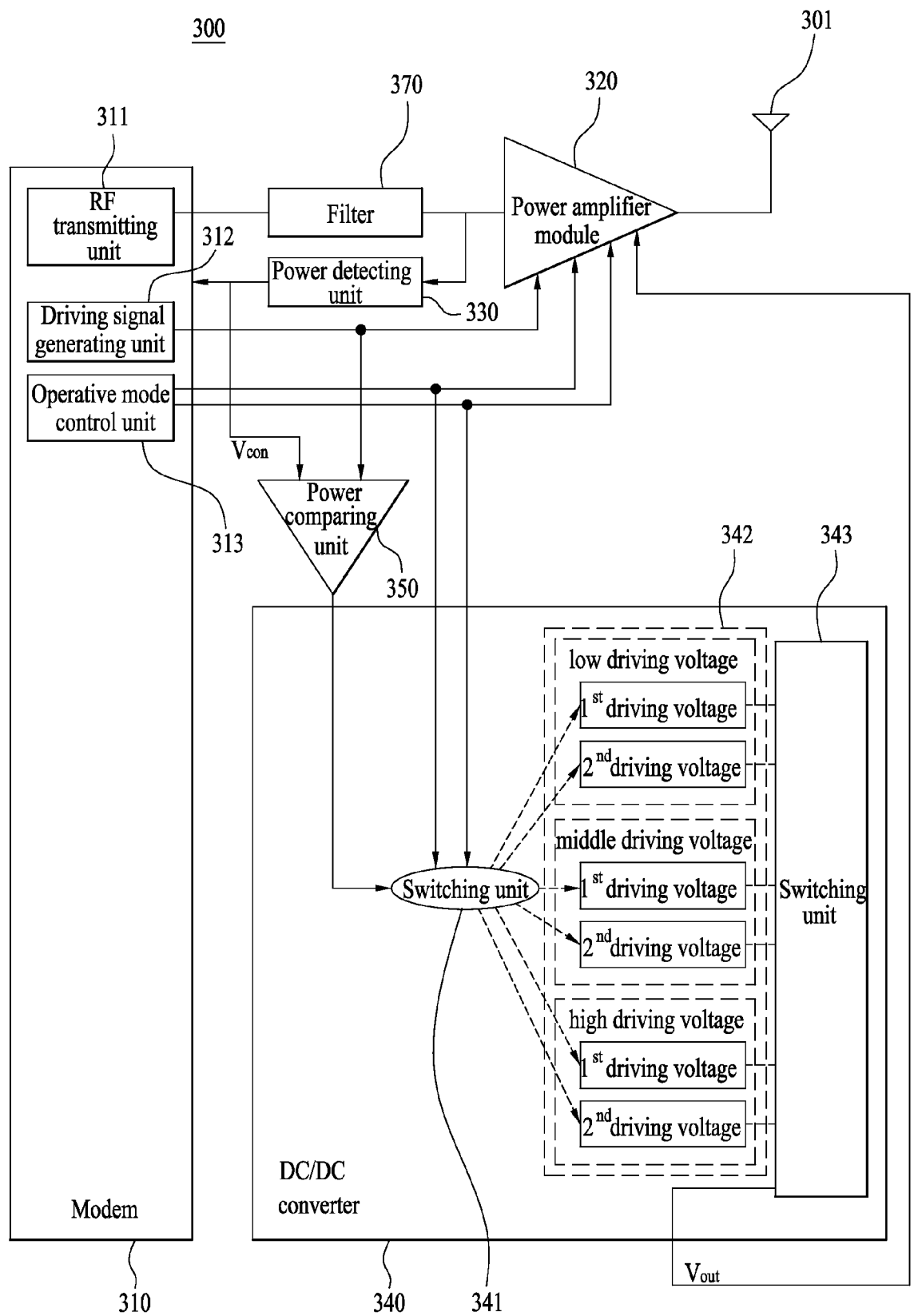
FIG. 7 and FIG. 8 are block diagrams of a mobile terminal according to a second embodiment of the present invention.
Figure 8:
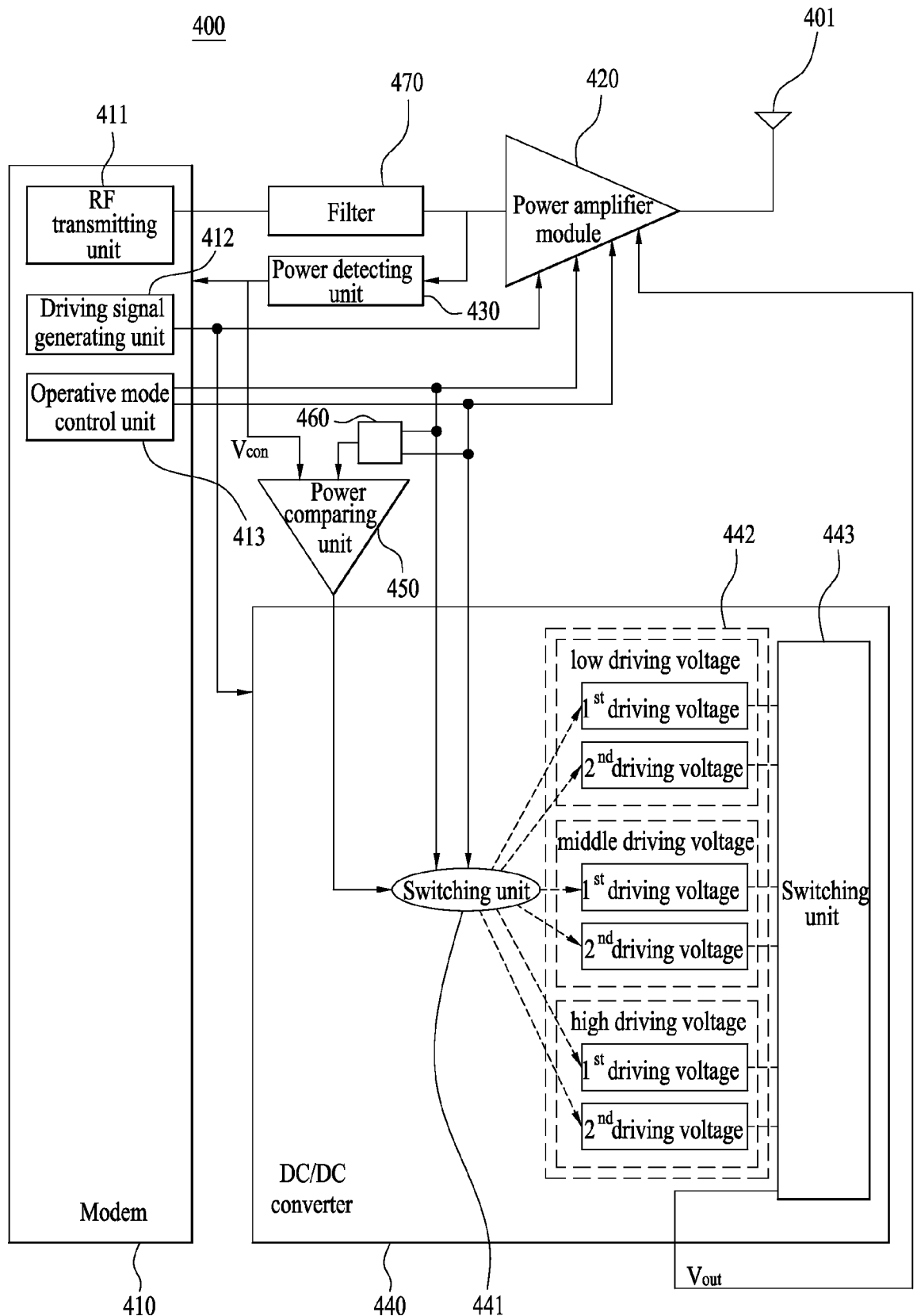

FIG. 7 and FIG. 8 are block diagrams of mobile terminal 300, 400 according to a second embodiment and a third embodiment of the present invention, respectively.

Referring to FIG. 7 and FIG. 8, the mobile terminal 300, 400 according to one embodiment of the present invention includes a power amplifier module 320, 420 configured to amplify power strength of an RF signal with a plurality of operative modes and a modem 310, 410 configured to deliver the RF signal to the power amplifier module 320, 420 and to control the operative mode of the power amplifier module 320, 420.

Moreover, the mobile terminal 300, 400 further includes a power detecting unit 330, 440 configured to output a detected power value Vcon (e.g., a detected voltage) by detecting the power strength of the RF signal outputted from the power amplifier module 320, 420, a power comparing unit 350, 450 configured to compare the detected power value Vcon to a prescribed reference power value (e.g., a reference voltage), and a DC/DC converter 340, 440 configured to supply a driving voltage Vout, which corresponds to an operative mode of the power amplifier module 320, 420 and a result value of the power comparing unit 350, 450, to the power amplifier module 320, 420.

Referring to FIG. 7 and FIG. 8, the RF transmitting unit 311, 411 receives an input of a baseband signal transmitted from the modem 310, 410 by wireless, converts the inputted signal to an RF signal, and then outputs the RF signal to the power amplifier module 320, 420.

In this case, a filter 370, 470 can be additionally provided between the RF transmitting unit 311, 411 and the power amplifier module 320, 420. The filter 370, 470 plays a role in matching the RF signal outputted from the RF transmitting unit 311, 411 to the power amplifier module 320, 420.

The power amplifier module 320, 420 amplifies the power strength of the RF signal outputted via the RF transmitting unit 311, 411 according to a mode selected from various amplification modes using the driving voltage Vout inputted from the DC/DC converter 340, 440 and then outputs the amplified RF signal to an antenna 301, 401. In this case, the amplification mode corresponds to the aforesaid operative mode of the power amplifier module 320, 420.

In particular, the power amplifier module 320, 420 amplifies a high-frequency signal and then delivers the amplified signal to a duplexer (not shown in the drawing). And, the antenna 301, 401 transmits the high-frequency signal delivered via the duplexer to a public channel.

The output dBm of the power amplifier module 320, 420 is inputted to the power detecting unit 330, 430. The power detecting unit 330, 430 converts the output dBm to a detected voltage Vcon corresponding to the output dBm and then delivers the detected voltage Vcon to the DC/DC converter 340, 440.

Referring to FIG. 7, the driving voltage Vout can be classified into one of a high driving voltage, a middle driving voltage and a low driving voltage according to the operative mode of the power amplifier module 320. And, each of the high, middle and low driving voltages can be classified into one of a first driving voltage and a second driving voltage according to a result value of the power comparing unit 350.

In particular, if the detected power value Vcon is equal to or greater than a prescribed reference power value in the DC/DC converter 340, 440, the first driving voltage can be selected. If the detected power value Vcon is smaller than a prescribed reference power value, the second driving voltage can be selected. In this case, the first driving voltage can be greater than the second driving voltage.

An operative mode control unit 313, 413 determines the operative mode of the power amplifier module 320, 420 by determining a strength of a signal received from an RF receiving unit (not shown in the drawing) and/or a range of the output dBm of the power amplifier module 320, 420, generates a signal corresponding to each operative mode, and then provides the generated signal to the power amplifier module 320, 420 and the DC/DC converter 340, 440.

For instance, a signal is received by a duplexer (not shown in the drawing) via the antenna 301, 401, an electric field strength is detected based on the received signal, the operative mode of the power amplifier module 320, 420 can then be determined according to the electric field strength.

The operative mode of the power amplifier module 320, 420 can include one of a high power mode, a middle power mode and a low power mode. The high power mode corresponds to the high driving voltage, the middle power mode corresponds to the middle driving voltage, and the low power mode corresponds to the low driving voltage.

Meanwhile, the number of the operative modes of the power amplifier module 320, 420 can be equal to 2 or at least 4. In this case, the number of the number of the driving voltages can be set to the number of the operative modes (i.e., 2 or at least 4).

The DC/DC converter 340, 440 can include a memory unit 342, 442 configured to store a plurality of driving voltages corresponding to the operative modes of the power comparing unit 350, 450 and a first switching unit 341, 441 configured to select one of the driving voltages according to the result value of the power comparing unit 350, 450 and the operative mode of the power amplifier module.

In the drawings, a reference number 343, 443 indicates a second switching unit. The second switching unit 343, 443 plays a role in delivering the selected driving voltage Vout outside the DC/DC converter 340, 440.

Moreover, the modem 310, 410 can include a driving signal generating unit 312, 412 configured to control at least one of the power amplifier module 320, 420, the DC/DC converter 340, 440 and the power comparing unit 350, 450 to be turned on/off.

Referring to FIG. 8, the mobile terminal 400 according to the third embodiment of the present invention can further include a comparison voltage generating unit 460 provided between the modem 410 and the power detecting unit 430. And, the comparison voltage generating unit 460 outputs a comparison voltage according to the operative mode of the power amplifier module 420 and then delivers the outputted comparison voltage to the power detecting unit 450.

The mobile terminal 400 shown in FIG. 8 is almost identical to the former mobile terminal 300 shown in FIG. 7 but differs in additionally including the comparison voltage generating unit 460. Therefore, the following description is made with reference to FIG. 7 only.

Meanwhile, the reference power value provided to the power comparing unit 350 can be determined according to the operative mode of the power amplifier module 320. For instance, the reference power value (hereinafter named a reference value) is about 1.4 V in case of the high power mode. And, the reference power value is about 0.9 V in case of the middle power mode. Moreover, the reference power value is about 0.4 V in case of the low power mode.

Thus, the power comparing unit 350 can be provided with a reference voltage corresponding to each operative mode of the power amplifier module 320.

And, as mentioned in the foregoing description, the reference voltage can increase higher toward a high middle power from a low middle power.

Moreover, as mentioned in the foregoing description, the driving voltage Vout outputted from the DC/DC converter 340 can include a minimum voltage that meets the adjacent channel leakage ratio according to the operative mode of the power amplifier module 320.

TABLE 2

| Classification | | Output (dBm) of power amplifier module | Driving voltage (Vout) | Reference voltage of power detecting unit |
|---|---|---|---|---|
| High driving voltage | $1^{st}$ driving voltage | 26.63 | 2.875 | 1.4 V |
| | | 25.25 | 2.875 | |
| | | 24.18 | 2.875 | |
| | | 23.13 | 2.875 | |
| | $2^{nd}$ driving voltage | 21.05 | 1.75 | |
| | | 19.97 | 1.75 | |
| | | 17.92 | 1.75 | |
| | | 15.83 | 1.75 | |
| Middle driving voltage | $1^{st}$ driving voltage | 15.46 | 2.325 | 0.9 V |
| | | 13.41 | 2.325 | |
| | | 12.37 | 2.325 | |
| | | 11.36 | 2.325 | |
| | $2^{nd}$ driving voltage | 10.33 | 1.425 | |
| | | 8.23 | 1.425 | |
| | | 7.21 | 1.425 | |
| | | 6.2 | 1.425 | |
| Low driving voltage | $1^{st}$ driving voltage | 5.2 | 1.6 | 0.4 V |
| | | 4.23 | 1.6 | |
| | | 3.25 | 1.6 | |
| | | 1.32 | 1.6 | |
| | $2^{nd}$ driving voltage | 0.34 | 1.05 | |
| | | −0.62 | 1.05 | |
| | | −2.61 | 1.05 | |
| | | −4.56 | 1.05 | |

Referring to Table 2, the power detecting unit 330 converts the output dBm of the power amplifier module 320 to a prescribed detected voltage and the outputs the prescribed detected voltage to the power comparing unit 350. The power comparing unit 350 then compares the detected voltage to the reference voltage.

In this case, the detected voltage can be proportional to the output dBm of the power amplifier module 320. And, the detected voltage is referred to in determining a relative size of the output dBm of the power amplifier module 320 in a high, middle or low power mode.

In particular, in case of the high power mode, the same driving voltage Vout is not always outputted in a corresponding power mode section. Instead, a relative size of the output dBm of the power amplifier module 320 is determined in the corresponding power mode section. A high driving voltage is outputted in a section having a relatively greater output dBm of the power amplifier module 320. And, a low driving voltage is outputted in a section having a relatively smaller output dBm of the power amplifier module 320.

In particular, through the power comparing unit 350, in case of a high power mode, a relative size of the output dBm of the power amplifier module 320 is determined in the corresponding power mode section. As mentioned in the foregoing description, the first driving voltage and the second driving voltage are respectively outputted.

Moreover, since the detected voltage and the reference voltage are relative to each other, a relative size of the output dBm of the power amplifier module 320 may be determined in a prescribed power mode section as well.

FIGS. 7 and 8 show a case that a single power comparing unit 350 is provided. Yet, the following is apparent to those skilled in the art. First of all, a plurality of power comparing units 350 can be provided to the mobile terminal 300, 400 according to the present invention. Secondly, the DC/DC converter 340 is able to output each of the first and second driving voltages in a prescribed power mode section. Thirdly, the DC/DC converter 340 is able to output each of $1^{st}$ to $N^{th}$ driving voltages in a prescribed power mode section.

Besides, operative modes of a power amplifier module 320 having 3 multi-stages in high to low power mode are subdivided to output driving voltages optimized for each of the subdivided operative modes. The optimized driving voltages can be then supplied to the power amplifier module.

Figure 9:
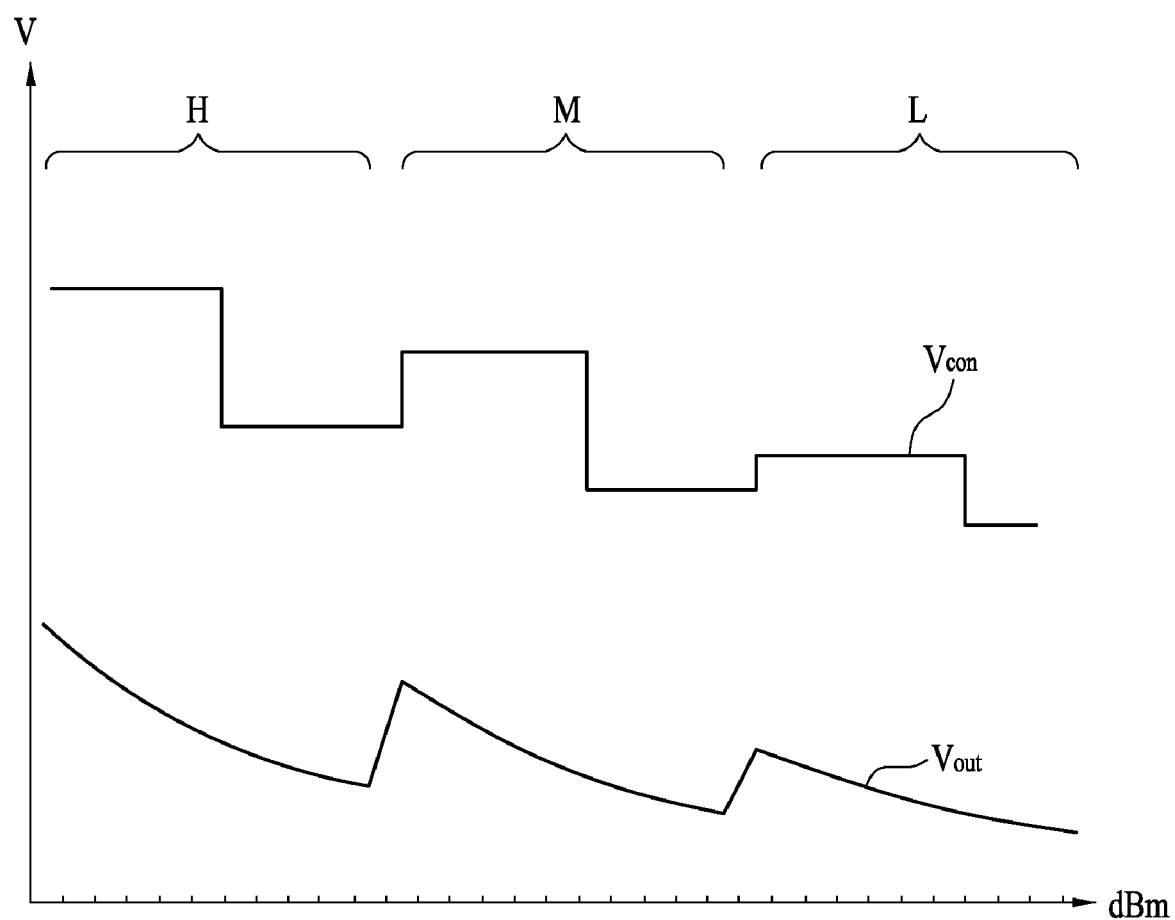
FIG. 9 is a graph for describing a relation between an output of a power amplifier module configuring a mobile terminal according to the second embodiment of the present invention and a driving voltage.

FIG. 9 is a graph for describing a relation between an output of a power amplifier module 320 configuring the mobile terminal and a driving voltage according to the second and third embodiments of the present invention.

As mentioned in the foregoing description, Vcon indicates a detected voltage outputted from the power detecting unit 330 and Vout indicates a driving voltage outputted from the DC/DC converter 340.

In the graph, 'H' indicates a high power mode, 'M' indicates a middle power mode, and 'L' indicates a low power mode.

If the driving voltage Vout of the power amplifier module 320 has a lower value, a current is not excessively supplied to the power amplifier module 320. Therefore, energy consumed as heat is minimized, whereby a current consumption decreasing effect of a battery can be maximized.

Referring to FIG. 9, each of the driving voltage Vout and the reference voltage Vcon rises high in the operative mode of the power amplifier module 320. This means that characteristics of a multi-stage power amplifier module 320 are taken into consideration.

As mentioned in the foregoing description, since the driving voltage Vout in each operative mode has a plurality of stages, further-subdivided and optimized driving voltages are outputted and then supplied to the power amplifier module 320.

The driving voltage Vout can include a minimum voltage that meets an adjacent channel leakage ratio (ACLR) of RF specification. Preferably, each driving voltage Vout is stored in the DC/DC converter 340 to meet the minimum voltage.

Through the DC/DC converter 340, the driving voltage Vout supplied to the power amplifier module 320 is selected according to the output dBm of the power amplifier module 320. As the driving voltage Vout is lowered according to the output dBm of the power amplifier module 320, a current can be prevented from being excessively supplied to the power amplifier module 320. Therefore, energy consumed as heat can be minimized so that a current consumption decreasing effect of a battery can be maximized.

Figure 10:
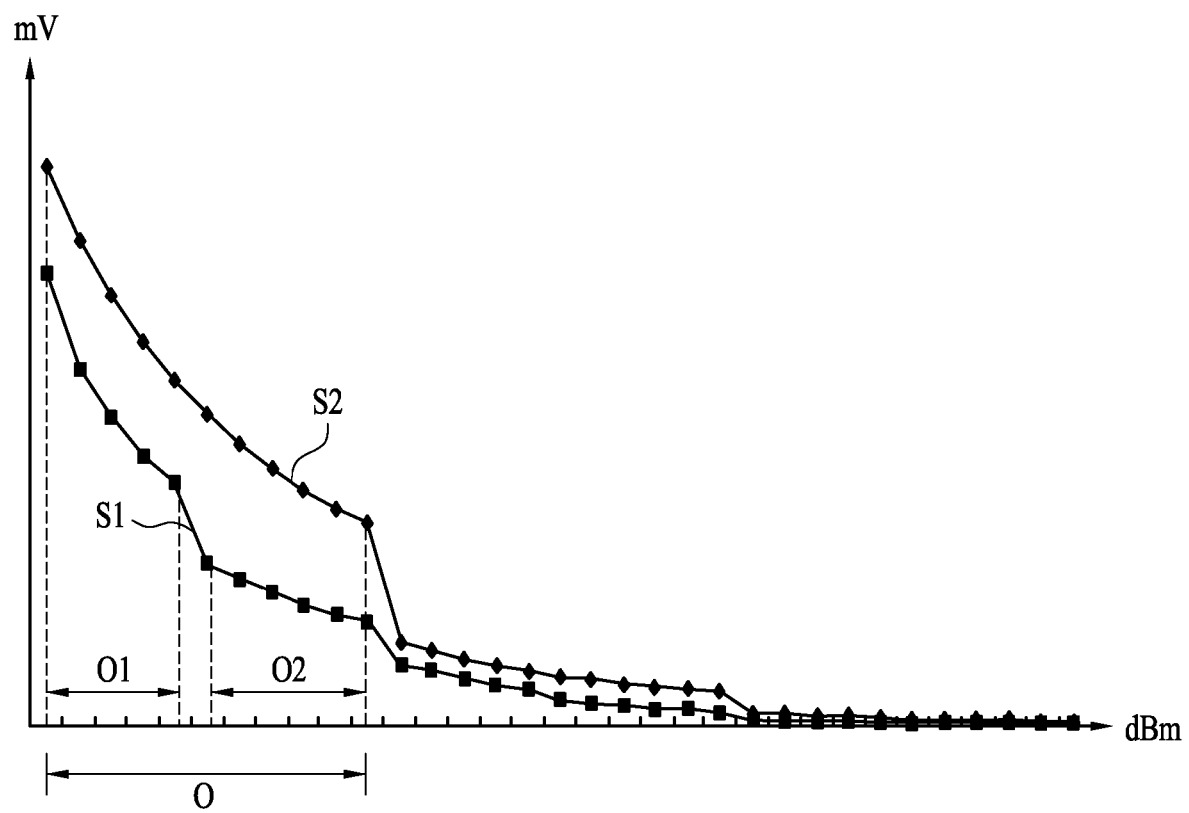
FIG. 10 is a graph for describing a relation between an output of a power amplifier module configuring a mobile terminal according to the second embodiment of the present invention and a current consumption.

FIG. 10 is a graph for describing a relation between an output of the power amplifier module 320 configuring a mobile terminal 300, 400 and a current consumption according to the second and third embodiments of the present invention.

In FIG. 10, 'S1' indicates a current consumption of a power amplifier module 320 in the mobile terminal 300, 400 according to the present invention. 'S2' indicates a current consumption of a power amplifier module in a mobile terminal according to the related art.

Referring to FIG. 10, 'S2' indicates a current consumption in case of using only a power amplifier module without adjusting a driving voltage. And, in each of 3 sections in which a current consumption abruptly changes, corresponds to high, middle and low power modes of a multi-stage power amplifier module.

'S1' shows a case that a driving voltage is adjusted according to an operative mode of the power amplifier module 320. In the mobile terminal 300, 400 according to the present invention, a driving voltage is provided as a plurality of stages in one power mode via the power comparing unit 350. Therefore, a further-subdivided optimal driving voltage may be supplied to the power amplifier module.

Referring to FIG. 10, the mobile terminal 300, 400 according to the present invention subdivides a high power mode section (O) into a section O1 for outputting a first driving voltage and a section O2 for outputting a second driving voltage, thereby minimizing a current consumption of a battery.

In the following description, a method of controlling a driving voltage of a power amplifier module 320 in the above-described mobile terminal 300, 400 according to the second and third embodiments of the present invention is explained in detail.

The method of controlling a driving voltage of a power amplifier module according to a second embodiment of the present invention includes (a) comparing an output of a power amplifier module and a reference power value to each other, (b) determining an operative mode of the power amplifier module, (c) outputting the driving voltage according to a result value in the step (a) and the operative mode, and (d) delivering the driving voltage to the power amplifier module.

As mentioned in the foregoing description, the driving voltage can be classified into a high driving voltage, a middle driving voltage and a low driving voltage according to the operative mode of the power amplifier module 320.

And, each driving voltage can be classified into a first driving voltage and a second driving voltage according to a result value of the power comparing unit 350. And, the operative mode of the power amplifier module 320 can include a high power mode, a middle power mode and a low power mode.

Thus, by further subdividing the operative mode of the power amplifier module 320, each optimal driving voltage corresponding to the output of the power amplifier module 320 may be output.

Accordingly, the present invention provides the following effects and/or advantages.

First of all, the present invention can minimize current consumption of a power amplifier module according to reception strength.

Secondly, the present invention can supply an optimal driving voltage to a power amplifier module by further subdividing each operative mode of the power amplifier module.

Thirdly, the present invention can reduce exothermic reaction in the course of a call.

Fourthly, the present invention can increase a duration time of a battery.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mobile terminal comprising:
    a power amplifier module having a plurality of operative modes and configured to amplify a power strength of an RF signal;
    a modem configured to provide the RF signal to the power amplifier module and to control the plurality of operative modes;
    a power detecting unit configured to detect the power strength of the RF signal output from the power amplifier module and to output a reference voltage; and
    a DC/DC converter configured to adjust the reference voltage according to a gain corresponding to each of the plurality of operative modes of the power amplifier module and to supply a driving voltage to the power amplifier module,
    wherein the modem comprises an operative mode control unit configured to determine the plurality of operative modes according to ranges of an output of the power amplifier module,
    wherein the ranges of the output of the power amplifier module are divided according to abrupt changes in current consumption, and
    wherein a size of the gain corresponding to each of the plurality of operative modes increases as the output of the power amplifier module moves toward a lower range from a higher range.

2. The mobile terminal of claim 1, wherein
    the plurality of operative modes include a high power mode, a middle power mode and a low power mode; and
    the gain corresponding to each of the plurality of operative modes includes a high gain corresponding to the high power mode, a middle gain corresponding to the middle power mode and a low gain corresponding to the low power mode.

3. The mobile terminal of claim 2, wherein a size of the gain corresponding to each of the plurality of operative modes increases as the gain moves toward the low gain from the high gain.

4. The mobile terminal of claim 1, wherein the DC/DC converter comprises:
    a memory unit configured to store a plurality of gains;
    a switching unit configured to select one of the stored plurality of gains according to a specific one of the plurality of operative modes; and
    a driving voltage adjusting unit configured to adjust the reference voltage using the selected one of the stored plurality of gains.

5. The mobile terminal of claim 4, wherein the DC/DC converter further comprises a gain adjusting unit configured to adjust a size of each of the stored plurality of gains.

6. The mobile terminal of claim 1, wherein the power detecting unit is further configured to output one of a plurality of reference voltages, each corresponding to an output of the power amplifier module.

7. The mobile terminal of claim 6, wherein the each of the plurality of reference voltages is proportional to the corresponding output of the power amplifier module.

8. The mobile terminal of claim 1, wherein the driving voltage includes a minimum voltage for satisfying an adjacent channel leakage ratio.

9. A mobile terminal comprising:
a power amplifier module having a plurality of operative modes and configured to amplify a power strength of an RF signal;
a modem configured to provide the RF signal to the power amplifier module and to control the plurality of operative modes;
a power detecting unit configured to detect the power strength of the RF signal output from the power amplifier module and to output a reference voltage;
a power comparing unit configured to compare the detected power strength to a reference power strength; and
a DC/DC converter configured to supply a driving voltage to the power amplifier module according to the comparison performed by the power comparing unit, the driving voltage corresponding to a specific one of the plurality of operative modes,
wherein the modem comprises an operative mode control unit configured to determine the plurality of operative modes according to ranges of an output of the power amplifier module,
wherein the ranges of the output of the power amplifier module are divided according to abrupt changes in current consumption, and
wherein the power strength is different for each of the plurality of operative modes.

10. The mobile terminal of claim 9, wherein the DC/DC converter is further configured to supply a high driving voltage, a middle driving voltage or a low driving voltage according to the specific one of the plurality of operative modes.

11. The mobile terminal of claim 9, wherein the DC/DC converter is further configured to supply a first driving voltage or a second driving voltage according to the comparison performed by the power comparing unit.

12. The mobile terminal of claim 11, wherein the DC/DC converter is further configured to:
supply the first driving voltage if the detected power strength is equal to or greater than the reference power strength; and
supply the second driving voltage if the detected power strength is less than the reference power strength.

13. The mobile terminal of claim 12, wherein the first driving voltage is greater than the second driving voltage.

14. The mobile terminal of claim 9, wherein the plurality of operative modes include a high power mode, a middle power mode and a low power mode.

15. The mobile terminal of claim 14, wherein the DC/DC converter comprises:
a memory unit configured to store a plurality of driving voltages according to the comparison performed by the power comparing unit and to store the plurality of operative modes; and
a switching unit configured to select the driving voltage according to the comparison performed by the power comparing unit and the specific one of the plurality of operative modes.

16. The mobile terminal of claim 9, wherein the reference power strength is determined according to the specific one of the plurality of operative modes.

17. The mobile terminal of claim 16, wherein the reference power strength increases toward a high middle power from a low middle power.

18. The mobile terminal of claim 9, wherein the power comparing unit is provided with a plurality of reference voltages, each corresponding to one of the plurality of operative modes.

19. The mobile terminal of claim 9, wherein the driving voltage includes a minimum voltage for satisfying an adjacent channel leakage ratio according to the specific one of the plurality of operative modes.

20. The mobile terminal of claim 9, further comprising a comparison voltage generating unit located between the modem and the power detecting unit and configured to:
output a comparison voltage according to the specific one of the plurality of operative modes; and
provide the comparison voltage to the power detecting unit.

* * * * *